(12) United States Patent
Yamanaka et al.

(10) Patent No.: US 6,859,023 B2
(45) Date of Patent: Feb. 22, 2005

(54) EVALUATION METHOD FOR EVALUATING INSULATING FILM, EVALUATION DEVICE THEREFOR AND METHOD FOR MANUFACTURING EVALUATION DEVICE

(75) Inventors: Michinari Yamanaka, Osaka (JP); Takayuki Yamada, Osaka (JP); Hiroaki Nakaoka, Kyoto (JP); Takeshi Yamashita, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 392 days.

(21) Appl. No.: 10/218,485

(22) Filed: Aug. 15, 2002

(65) Prior Publication Data

US 2003/0040132 A1 Feb. 27, 2003

(30) Foreign Application Priority Data

Aug. 17, 2001 (JP) .................................... 2001-247970

(51) Int. Cl.[7] ................. G01R 31/00; H01L 21/00; H01L 23/58
(52) U.S. Cl. ............. 324/71.1; 438/18; 257/48
(58) Field of Search ............ 438/14, 17, 18; 324/71.1, 71.5; 257/48

(56) References Cited

FOREIGN PATENT DOCUMENTS

| JP | 7-161786 | 6/1995 |
| JP | 10-270520 | 10/1998 |
| JP | 2001-189361 A | 7/2001 |
| JP | 2001-332596 A | 11/2001 |

*Primary Examiner*—Evan Pert
(74) *Attorney, Agent, or Firm*—McDermott Will & Emery LLP

(57) ABSTRACT

A method for evaluating an insulating film includes: a first step of forming an insulating film on a semiconductor substrate including a p-n junction therein; a second step of selectively forming an electrode pattern on the insulating film; a third step of forming a measurement electrode on the insulating film so as to be electrically insulated from the electrode pattern; and a fourth step of applying a measurement voltage between the measurement electrode and the semiconductor substrate via the insulating film and measuring a leakage current leaking through the p-n junction so as to evaluate a damage to the insulating film or the semiconductor substrate.

16 Claims, 12 Drawing Sheets

EVALUATION METHOD FOR EVALUATING INSULATING FILM, EVALUATION DEVICE THEREFOR AND METHOD FOR MANUFACTURING EVALUATION DEVICE

BACKGROUND OF THE INVENTION

The present invention relates to an evaluation method for evaluating the presence/absence of a damage to an insulating film, an evaluation device therefor, and a method for manufacturing the evaluation device.

In recent years, along with the demand for increasing the speed and performance of LSIs, the thickness of a gate insulating film of a MIS transistor has been reduced. Accordingly, how to suppress the damage to the gate insulating film due to the dry etching step of forming a gate electrode by patterning has been an important problem in the art.

A conventional method for forming a gate electrode made of polycrystalline silicon will now be outlined with reference to FIG. 11A and FIG. 11B.

First, as illustrated in FIG. 11A, a gate oxide film 102 having a thickness of about 2 nm is formed on the principal surface of a semiconductor substrate 101 made of silicon, including a p-type well 101a formed in an upper portion thereof, and then a gate forming film 103A made of polycrystalline silicon is deposited thereon. Then, a resist pattern 110 having a gate pattern is formed on the gate forming film 103A by using a photolithography method.

Then, the gate forming film 103A is dry-etched while using the resist pattern 110 as a mask so as to form a gate electrode 103B having a gate length of about 0.1 μm from the gate forming film 103A, thereby obtaining a structure as illustrated in FIG. 11B. The dry etching process is performed by using, for example, an inductively-coupled plasma (ICP) etcher.

Exemplary etching conditions are as follows:

| | |
|---|---|
| (1) Flow amount of etching gas: | hydrogen bromide (HBr):chlorine ($Cl_2$):oxygen ($O_2$) = 70:30:3 |
| (2) Pressure: 1 Pa | |
| (3) ICP power: 300 W | |
| (4) Bias power: 100 W | |
| (5) Etch selectivity of gate forming film with respect to gate oxide film: | Etch rate for polycrystalline silicon film/Etch rate for gate oxide film = 50 |

Although the gate forming film 103A is overetched by about 30% in the gate pattern dry etching step, it is possible to reliably stop the etching at the gate oxide film 102 because of the sufficiently high etch selectivity. Thus, the semiconductor substrate 101 is not etched.

Along with the reduction in the thickness of the gate oxide film 102, the etch selectivity that is required for the gate forming film 103A is increasing. Nevertheless, with the advancements in the etching technology, it is now possible to obtain an etch selectivity of 100 or more.

However, the conventional method for forming a gate electrode has a problem in that a punch-through occurs in the gate oxide film 102 when the thickness of the gate oxide film 102 is reduced to be 10 nm or less. A punch-through refers to a ruptured hole 104 that occurs in a portion of the gate oxide film 102 beside the gate electrode 103B even though the etching should theoretically be stopped by the gate oxide film 102 in view of the sufficient etch selectivity. FIG. 12 illustrates the ruptured hole (punch-through) 104 occurring in the gate oxide film 102.

The cause of a punch-through will now be described with reference to FIG. 13.

As illustrated in FIG. 13, normally, when dry-etching the gate electrode 103B, an etchant (etching species) that contains halogen ionc and oxygen ionc and a depositing radicalc that contain a halogenide of silicon, which are supplied from a plasma, competitively interact with each other, thereby causing the etching to proceed while realizing a necessary etch selectivity.

Specifically, the etching of the gate oxide film 102 proceeds in a state where the flux of the etchant is larger than the flux of the depositing radical, whereas the etching of the gate oxide film 102 is suppressed in a state where the flux of the etchant is smaller than the flux of the depositing radical. As a result, in a state where the flux of the etchant is smaller than the flux of the depositing radical, the etch selectivity of the gate forming film 103A with respect to the gate oxide film 102 is high.

In this process, the depositing radical is supplied from a plasma in an isotropic manner. Therefore, in a region of the gate oxide film 102 beside the gate electrode 103B, e.g., a region within a distance of d from the side surface of the gate electrode 103B, a sufficient amount of depositing radical is not supplied due to a so-called "shadowing effect" with the gate electrode 103B of a certain height being a standing wall. In addition, in the region within the distance of d from the side surface of the gate electrode 103B, an etchant having been reflected by the side wall surface of the gate electrode 103B locally impinges on the gate oxide film 102.

Thus, even though the semiconductor substrate 101 as a whole is in a state where the etching of the gate oxide film 102 does not proceed with the flux of the etchant being smaller than the flux of the depositing radical, the region in the vicinity of the side wall of the gate electrode 103B is locally in a state where the flux of the etchant is larger than the flux of the depositing radical. Therefore, the punch-through 104 occurs in the region of the gate oxide film 102 that is in the vicinity of the side wall of the gate electrode 103B as illustrated in FIG. 12.

Incidentally, the evaluation of the presence/absence of the punch-through 104 occurring in the gate oxide film 102 is typically performed by observing the surface condition of the gate oxide film 102 by using an optical microscope or a scanning electron microscope.

However, the conventional method for evaluating a gate oxide film has a problem in that it is not possible to evaluate and observe the entire surface of the semiconductor substrate 101, and another problem in that visual observation is instable and unreliable.

SUMMARY OF THE INVENTION

The present invention has been made to solve these problems in the prior art and has an object to make it possible to easily and reliably evaluate damage to an insulating film occurring in the dry etching step across the entire surface of a semiconductor substrate.

In order to achieve the object, according to the present invention, a voltage is applied between an insulating film, which has been dry-etched to be exposed on the principal surface of a semiconductor substrate having a p-n junction, and the semiconductor substrate so that the p-n junction is reverse-biased, and a damage to the insulating film is evaluated by measuring the amount of leakage current through the p-n junction.

The depth of a punch-through that occurs in a gate oxide film on an active region, which is a source or a drain, in a MOS transistor is typically on the order of 10 nm to 100 nm.

In view of this, the present inventors have made various studies to discover that the value of a leakage current occurring through a p-n junction, which is formed in an upper portion of a semiconductor substrate with the junction plane being shallower than a punch-through, is larger than that when there is no punch-through by an order of magnitude or more. Moreover, the present inventors have also discovered that even if a p-n junction plane is located deeper than a punch-through, the p-n junction plane experiences a strain and/or a leakage current.

The present invention applies leakage current characteristics of a p-n junction that have been obtained based on the discoveries to the evaluation of a damage to an insulating film.

Specifically, a method for evaluating an insulating film of the present invention includes: a first step of forming an insulating film on a semiconductor substrate including at an upper portion thereof a first semiconductor region of a first conductivity type; a second step of selectively forming an electrode pattern on the insulating film; a third step of introducing an impurity of a second conductivity type into the semiconductor substrate using the electrode pattern as a mask so as to form a second semiconductor region of the second conductivity type in an upper portion of the first semiconductor region, thereby forming a p-n junction at an interface between the first semiconductor region and the second semiconductor region; a fourth step of forming a measurement electrode on the insulating film so as to be electrically insulated from the electrode pattern; and a fifth step of applying a measurement voltage between the measurement electrode and the semiconductor substrate via the insulating film and measuring a leakage current leaking through the p-n junction so as to evaluate a damage to the insulating film or the semiconductor substrate.

With the method for evaluating an insulating film of the present invention, it is possible to electrically observe the condition of an insulating film on a semiconductor substrate without using an optical method such as a microscope. As a result, it is possible to easily and reliably evaluate a damage to the insulating film occurring in the dry etching step across the entire surface of the semiconductor substrate.

In the method for evaluating an insulating film of the present invention, it is preferred that in the fifth step, the insulating film is determined to be defective if a value of the leakage current is greater than a predetermined value, whereas the insulating film is determined to be non-defective if the value of the leakage current is less than or equal to the predetermined value.

Moreover, in the method for evaluating an insulating film of the present invention, it is preferred that in the fifth step, a value of a first leakage current occurring in response to a first measurement voltage is compared with a value of a second leakage current occurring in response to a second measurement voltage that is higher than the first measurement voltage, and the insulating film is determined to be defective if the value of the second leakage current is greater than the value of the first leakage current, whereas the insulating film is determined to be non-defective if the value of the second leakage current is less than or equal to the value of the first leakage current.

Moreover, in the method for evaluating an insulating film of the present invention, it is preferred that in the fifth step, the insulating film is determined to be defective if a rate of change of the leakage current increases as the measurement voltage is increased, whereas the insulating film is determined to be non-defective if the rate of change of the leakage current does not substantially change as the measurement voltage is increased.

In the method for evaluating an insulating film of the present invention, it is preferred that the electrode pattern has a comb-like shape as viewed from above.

In this way, the etchant of the dry etching is localized in a region of the insulating film that is surrounded by the teeth, i.e., protruding portions, of the comb-shaped electrode pattern, thereby increasing the damage to the insulating film. Thus, it is possible to increase the leakage current measurement sensitivity.

In the method for evaluating an insulating film of the present invention, it is preferred that the second step includes a step of forming a dummy electrode pattern on the insulating film with an interval from the electrode pattern.

In the method for evaluating an insulating film of the present invention, it is preferred that: the first step includes a step of preparing a first semiconductor substrate and a second semiconductor substrate having the same structure as that of the semiconductor substrate; the fourth step includes, before forming the measurement electrode: a step of forming a first side wall insulating film on a side surface of an electrode pattern on the first semiconductor substrate; and a step of forming a second side wall insulating film on a side surface of an electrode pattern on the second semiconductor substrate, the second side wall insulating film having a thickness different from that of the first side wall insulating film, wherein in the fifth step, the first semiconductor substrate on which the first side wall insulating film has been formed, and the second semiconductor substrate on which the second side wall insulating film has been formed, are each evaluated.

In this way, the position at which the insulating film is damaged can be determined by the use of the side wall insulating films having different thicknesses.

In the method for evaluating an insulating film of the present invention, it is preferred that the insulating film is a gate insulating film and the electrode pattern is a gate electrode.

In this way, it is possible to evaluate the presence/absence of a damage to a gate insulating film that is left unremoved on an active region after the formation of the gate electrode. Therefore, it is possible to optimize the etching conditions of the dry etching process in the patterning step for forming the gate electrode and the design pattern determined when designing the gate electrode pattern.

A device for evaluating an insulating film of the present invention includes: a first insulating film formed on an upper surface of a semiconductor substrate including a p-n junction therein; an electrode pattern selectively formed on the first insulating film; and a measurement electrode formed on the first insulating film, with a second insulating film being interposed between the electrode pattern and the measurement electrode.

As described above, the device for evaluating an insulating film of the present invention includes: the first insulating film formed on the upper surface of the semiconductor substrate including the p-n junction therein; the electrode pattern selectively formed on the first insulating film; and the measurement electrode formed on the first insulating film, with the second insulating film being interposed between the electrode pattern and the measurement electrode, whereby it is possible to reliably realize the method for evaluating an insulating film of the present invention.

In the device for evaluating an insulating film of the present invention, it is preferred that the electrode pattern has a comb-like shape as viewed from above.

It is preferred that the device for evaluating an insulating film of the present invention further includes a dummy electrode pattern formed on the first insulating film with an interval from the electrode pattern.

In the device for evaluating an insulating film of the present invention, it is preferred that the first insulating film is a gate insulating film and the electrode pattern is a gate electrode.

A method for manufacturing an insulating film evaluation device of the present invention includes: a first step of forming a first insulating film on an upper surface of a semiconductor substrate including a first semiconductor region of a first conductivity type formed in an upper portion of the semiconductor substrate; a second step of selectively forming an electrode pattern on the first insulating film; a third step of introducing an impurity of a second conductivity type into the semiconductor substrate using the electrode pattern as a mask so as to form a second semiconductor region of the second conductivity type in an upper portion of the first semiconductor region, thereby forming a p-n junction at an interface between the first semiconductor region and the second semiconductor region; and a fourth step of forming a measurement electrode on the first insulating film, with a second insulating film being interposed between the electrode pattern and the measurement electrode.

According to the method for manufacturing an insulating film evaluation device of the present invention, the first insulating film is formed on the upper surface of the semiconductor substrate including the first semiconductor region of the first conductivity type formed in the upper portion of the semiconductor substrate, and the electrode pattern is selectively formed on the first insulating film. Then, the impurity of the second conductivity type is introduced into the semiconductor substrate using the electrode pattern as a mask so as to form the second semiconductor region of the second conductivity type in the upper portion of the first semiconductor region, thereby forming the p-n junction at the interface between the first semiconductor region and the second semiconductor region. Furthermore, the measurement electrode is formed on the first insulating film, with the second insulating film being interposed between the electrode pattern and the measurement electrode. Thus, it is possible to reliably obtain the insulating film evaluation device of the present invention.

In the method for manufacturing an insulating film evaluation device of the present invention, it is preferred that in the second step, the electrode pattern is patterned into a comb-like shape as viewed from above.

In the method for manufacturing an insulating film evaluation device of the present invention, it is preferred that the second step includes a step of forming a dummy electrode pattern on the insulating film with an interval from the electrode pattern.

In the method for manufacturing an insulating film evaluation device of the present invention, it is preferred that the first insulating film is a gate insulating film and the electrode pattern is a gate electrode.

BRIEF DESCRIPTION OF TILE DRAWINGS

FIG. 1A and FIG. 1B illustrate a device for evaluating a gate insulating film according to the first embodiment of the present invention, wherein FIG. 1A is a plan view, and FIG. 1B is a cross-sectional view taken along line Ib—Ib of FIG. 1A.

FIG. 2A and FIG. 2B are graphs each illustrating the relationship (I–V characteristics) between a leakage current through a p-n junction, which is measured by using the device for evaluating a gate insulating film according to the first embodiment of the present invention, and an applied voltage, wherein FIG. 2A illustrates the relationship where no punch-through has occurred in the gate insulating film, and FIG. 2B illustrates the relationship where a punch-through has occurred in the gate insulating film.

FIG. 3A and FIG. 3B are scanning electron microscope (SEM) pictures illustrating a gate electrode having a comb shape as viewed from above and a gate insulating film on an active region, wherein FIG. 3A illustrates a state where a punch-through has occurred in the gate insulating film, and FIG. 3B illustrates a state where a punch-through has not occurred in the gate insulating film.

Figure 4A:
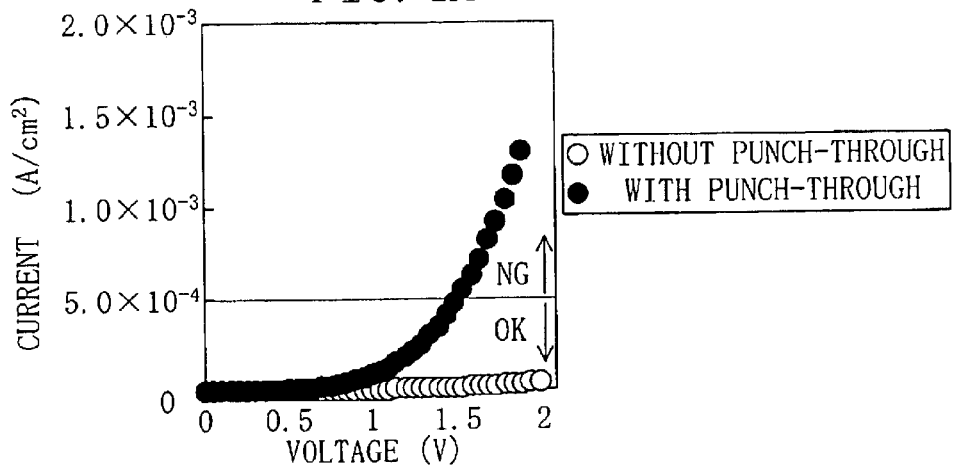
Figure 4B:
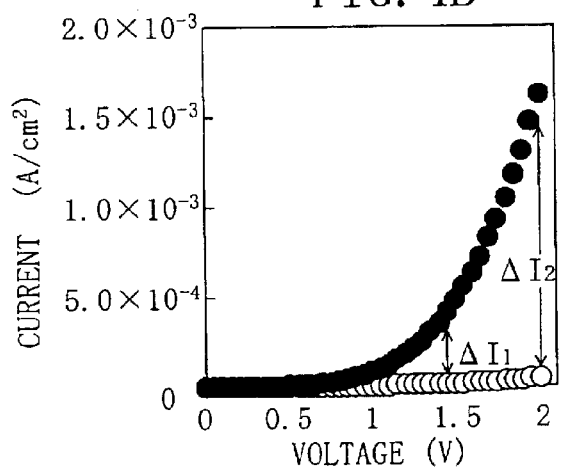
Figure 4C:
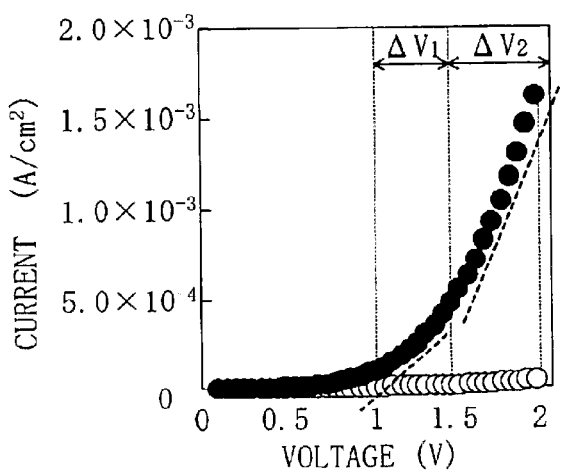

FIG. 4A to FIG. 4C each illustrate a method for determining the quality of a gate insulating film by using a method for evaluating a gate insulating film according to the first embodiment of the present invention, wherein FIG. 4A is a graph illustrating the first determination method, which is based on a reference leakage current value, FIG. 4B is a graph illustrating the second determination method, which is based on the difference between leakage currents for different applied voltages, and FIG. 4C is a graph illustrating the third determination method, which is based on the ratio of the leakage current increment with respect to the applied voltage increment.

FIG. 5A to FIG. 5E are cross-sectional views sequentially illustrating steps of a method for manufacturing a device for evaluating a gate insulating film according to the second embodiment of the present invention.

Figure 6A:
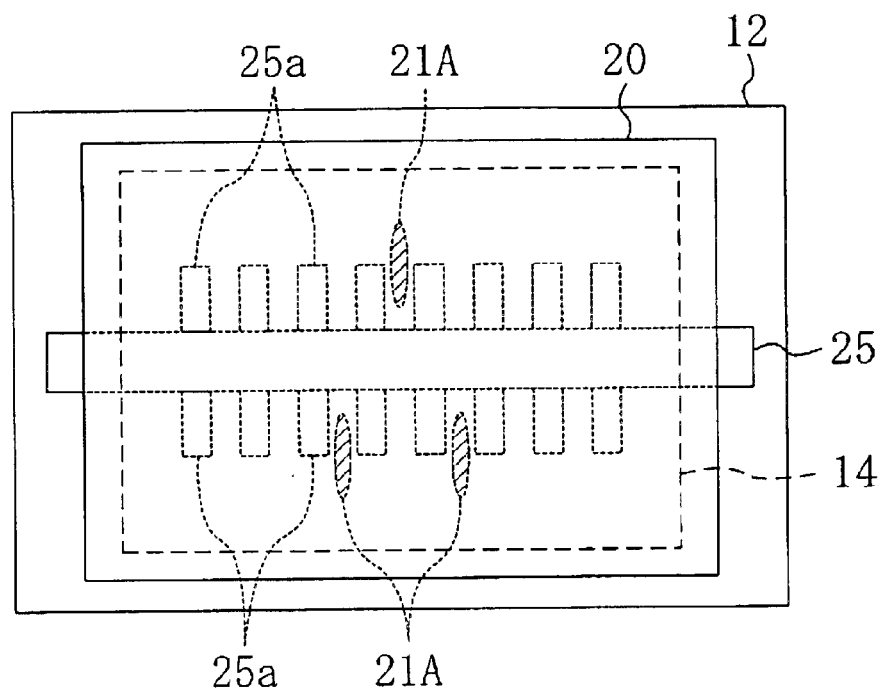
Figure 6B:
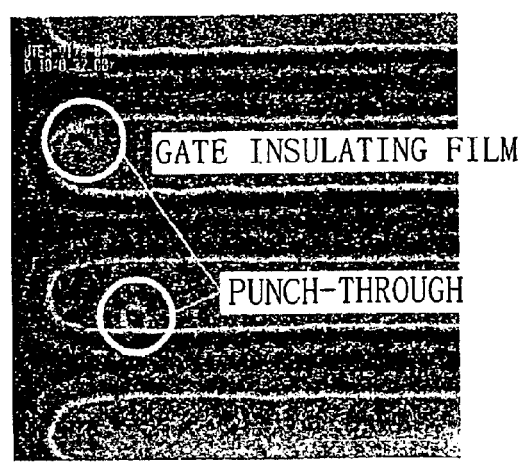

FIG. 6A and FIG. 6B illustrate a device for evaluating a gate insulating film according to the third embodiment of the present invention, wherein FIG. 6A is a plan view, and FIG. 6B is an SEM picture showing a portion of the device in the vicinity of the gate electrode.

Figure 7:
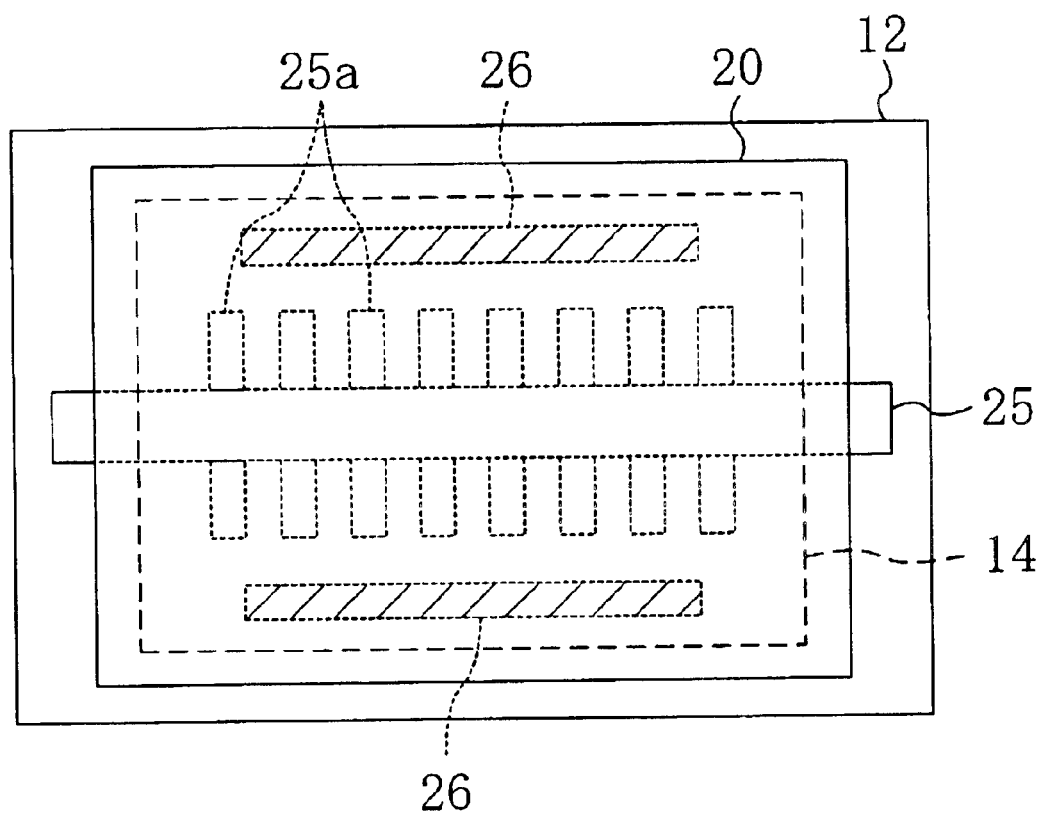

FIG. 7 is a plan view illustrating a device for evaluating a gate insulating film according to the fourth embodiment of the present invention.

Figure 8:
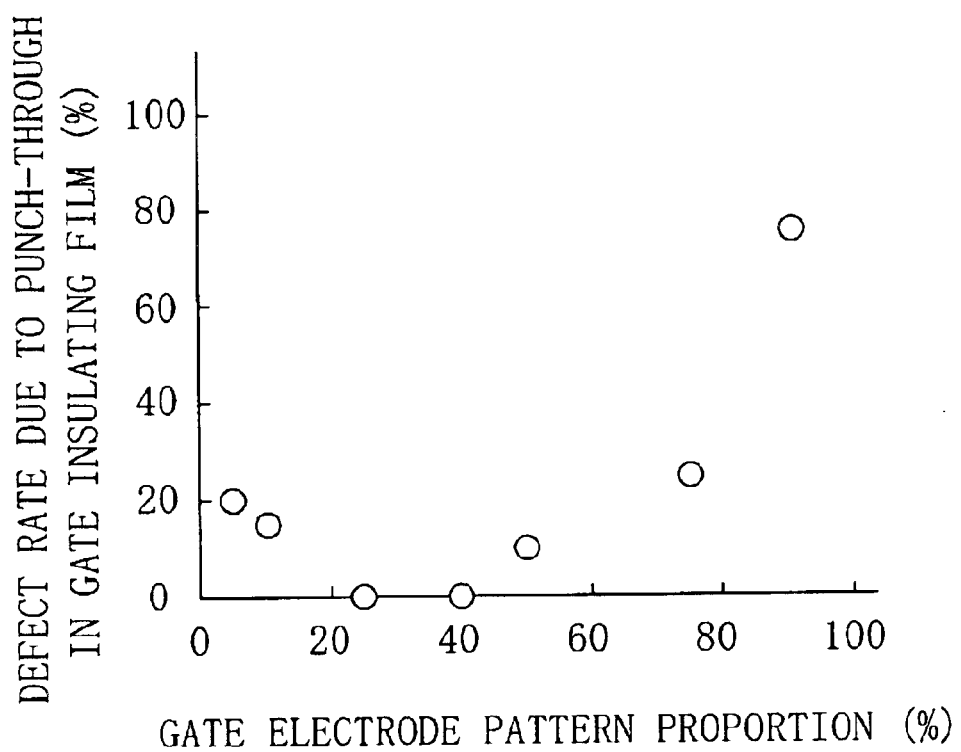

FIG. 8 is a graph illustrating the relationship between the gate electrode pattern proportion and the defect rate due to the punch-through in the gate insulating film, which is obtained by using the device for evaluating a gate insulating film according to the fourth embodiment of the present invention.

FIG. 9A to FIG. 9E are cross-sectional views sequentially illustrating steps of a method for manufacturing a first evaluation device for evaluating a gate insulating film according to the fifth embodiment of the present invention.

FIG. 10A to FIG. 10E are cross-sectional views sequentially illustrating steps of a method for manufacturing a second evaluation device for evaluating a gate insulating film according to the fifth embodiment of the present invention.

Figure 11A:
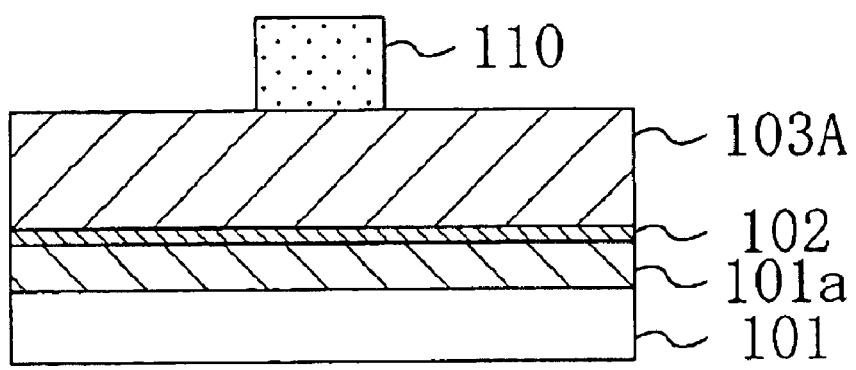
Figure 11B:
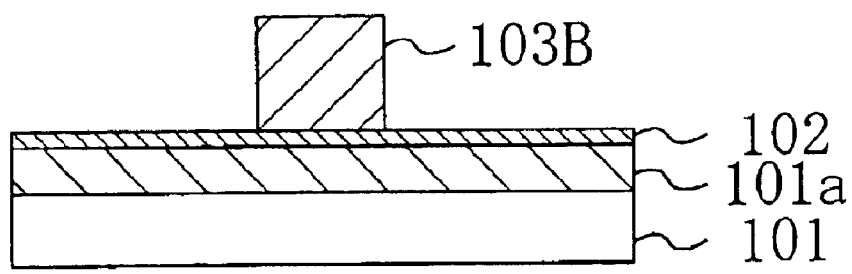

FIG. 11A and FIG. 11B are cross-sectional views sequentially illustrating steps of a method for forming a gate electrode made of polycrystalline silicon in the prior art.

Figure 12:
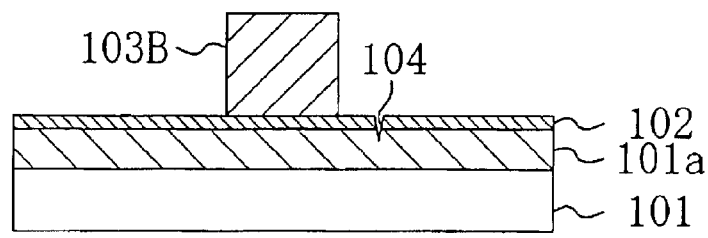

FIG. 12 is a cross-sectional view schematically illustrating a punch-through occurring during the formation of a gate electrode made of polycrystalline silicon in the prior art.

Figure 13:
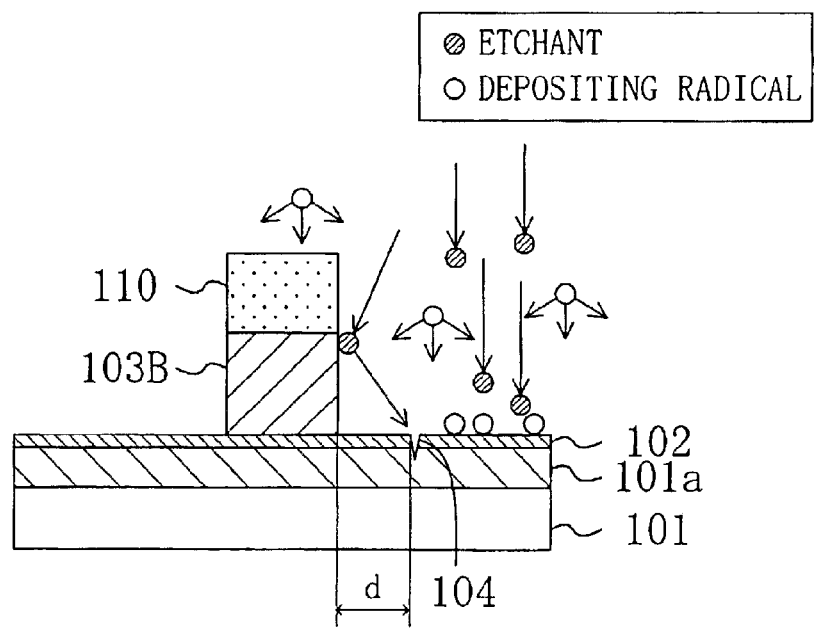

FIG. 13 is a schematic cross-sectional view illustrating the cause of the occurrence of a punch-through in a gate electrode made of polycrystalline silicon in the prior art.

DETAILED DESCRIPTION OF THE INVENTION

First Embodiment

The first embodiment of the present invention will now be described with reference to the drawings.

Figure 1A:
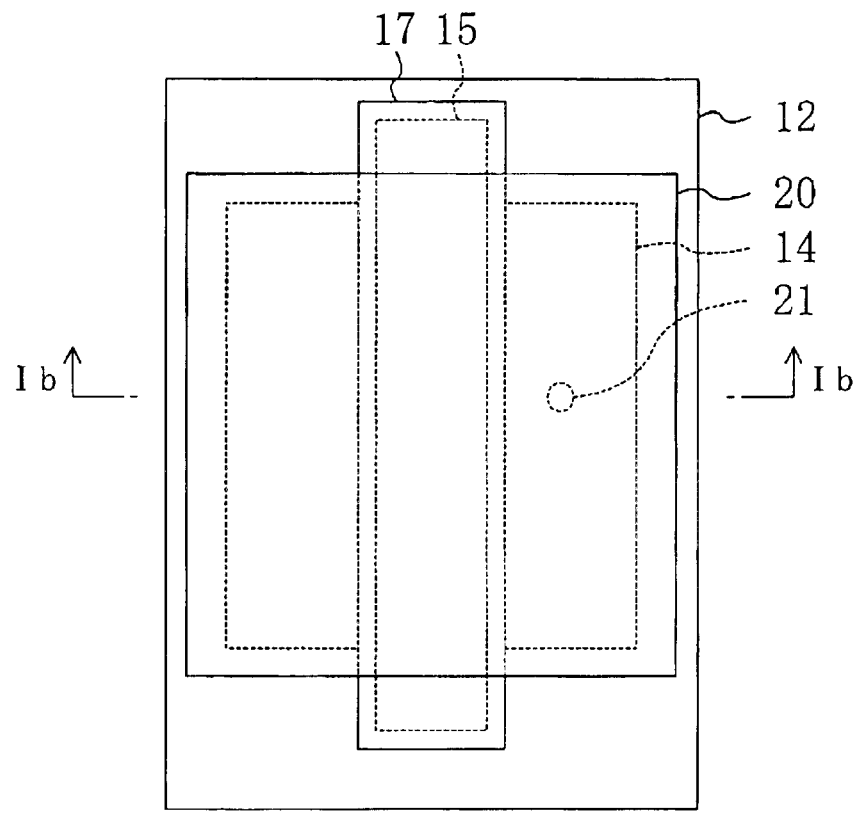
Figure 1B:
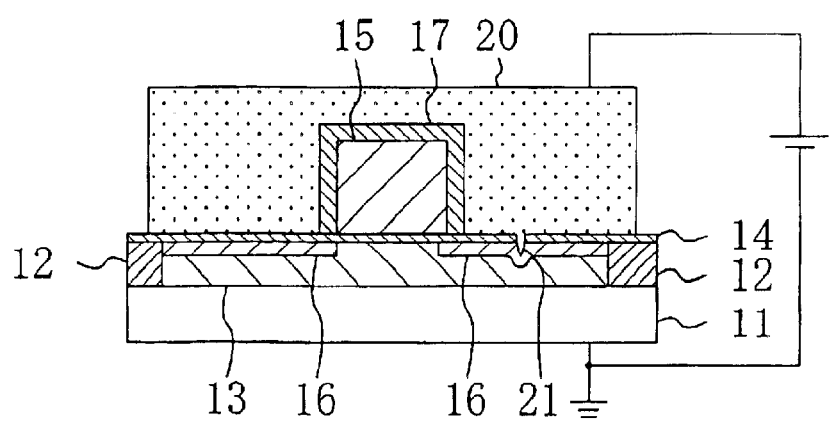

FIG. 1A and FIG. 1B illustrate a device for evaluating a gate insulating film according to the first embodiment of the present invention, wherein FIG. 1A is a plan view, and FIG. 1B is a cross-sectional view taken along line Ib—Ib of FIG. 1A. Herein, a device for evaluating the presence/absence of a damage to a gate insulating film on an active region of one of a plurality of transistors formed on a semiconductor wafer is illustrated for ease of understanding.

As illustrated in FIG. 1A and FIG. 1B, a semiconductor substrate (wafer) 11 made of silicon (Si), for example, includes, in an upper portion thereof, device isolation regions 12 made of silicon oxide ($SiO_2$) and a $p^+$-type layer 13 surrounded by the device isolation regions 12.

A gate insulating film 14 is formed by a thermal oxidation method, for example, on the principal surface of the semiconductor substrate 11, and a gate electrode 15 is formed on the gate insulating film 14 generally at the center of the $p^+$-type layer 13. The gate electrode 15 is made of polysilicon doped with an n-type impurity such as phosphorus (P) or arsenic (As).

An $n^+$-type layer (active layer) 16 to be a source or a drain having a junction plane that is shallower than the $p^+$-type layer 13 is formed in a region of the $p^+$-type layer 13 beside the gate electrode 15, thereby forming a p-n junction at the interface between the $p^+$-type layer 13 and the $n^+$-type layer 16.

The side surface and the upper surface of the gate electrode 15 are covered with an insulating film 17 made of silicon oxide, silicon nitride ($Si_3N_4$), or the like, and a measurement electrode 20 made of polysilicon doped with an n-type impurity is formed on the gate insulating film 14 so as to cover the gate electrode 15 and the insulating film 17.

Thus, in the device for evaluating a gate insulating film of the present embodiment, the gate electrode 15 and the measurement electrode 20 are electrically insulated from each other by the insulating film 17 covering the gate electrode 15. Moreover, the semiconductor substrate 11 is shown to have a punch-through 21 running through the gate insulating film 14 and into the underlying $n^+$-type layer 16 due to the dry etching in the patterning step for forming the gate electrode 15.

Note that the $p^+$-type layer 13 may be formed by an ion implantation method, or the semiconductor substrate 11 of a p-type conductivity may alternatively be used.

Moreover, while the measurement electrode 20 is provided on both sides of the gate electrode 15 in the first embodiment, the measurement electrode 20 may alternatively be provided only on one side of the gate electrode 15.

Evaluation Method

A method for evaluating a gate insulating film using an evaluation device having such a structure as described above will now be described.

As illustrated in FIG. 1B, a measurement voltage is applied between the measurement electrode 20 and the semiconductor substrate 11 so that the p-n junction between the $p^+$-type layer 13 and the $n^+$-type layer 16 is reverse-biased, and a leakage current through the p-n junction is measured. In the first embodiment, since the measurement electrode 20 is connected to the $n^+$-type layer 16, a positive voltage is applied to the measurement electrode 20 while a negative voltage is applied to the semiconductor substrate 11.

Figure 2A:
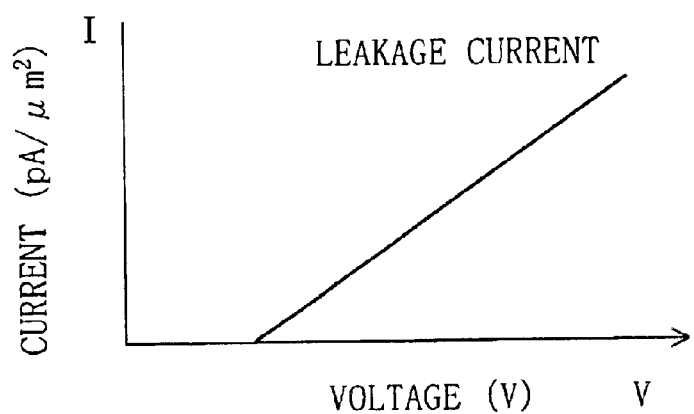
Figure 2B:
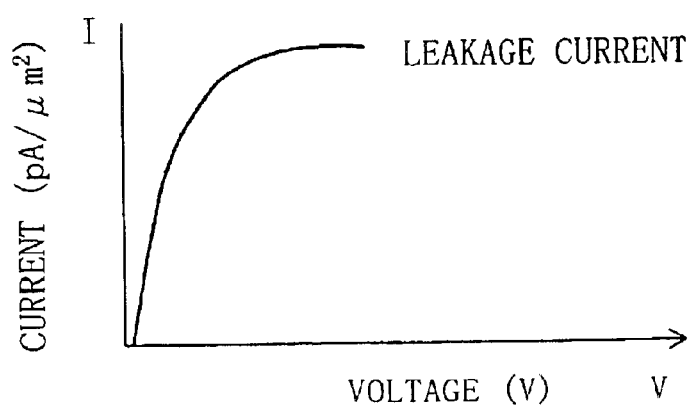

FIG. 2A and FIG. 2B each illustrate the relationship (I–V characteristics) between the leakage current through the p-n junction, which is measured by using the device for evaluating a gate insulating film of the first embodiment, and an applied voltage, wherein FIG. 2A illustrates the relationship where no punch-through has occurred in the gate insulating film, and FIG. 2B illustrates the relationship where a punch-through has occurred in the gate insulating film. Herein, the horizontal axis represents the applied voltage and the vertical axis represents the leakage current.

As illustrated in FIG. 2A, in a case where the punch-through 21 has not occurred in the gate insulating film 14, the leakage current increases in proportion to the applied voltage after the applied voltage (measured voltage) exceeds a predetermined value.

In contrast, in a case where the punch-through 21 has occurred in the gate insulating film 14, the punch-through 21 is formed with a concave-shaped cross section passing through the gate insulating film 14 and into an upper portion of the semiconductor substrate 11 to a depth on the order of 10 nm, as described above, whereby the bottom portion thereof is located below the p-n junction plane. Therefore, as illustrated in FIG. 2B, the leakage current through the p-n junction starts occurring at a lower applied voltage with the punch-through 21 than without the punch-through 21. Furthermore, it has been confirmed that the leakage current with the punch-through 21 is greater than that without the punch-through 21 by about one or two orders of magnitude in an early stage of the voltage application.

Figure 3A:
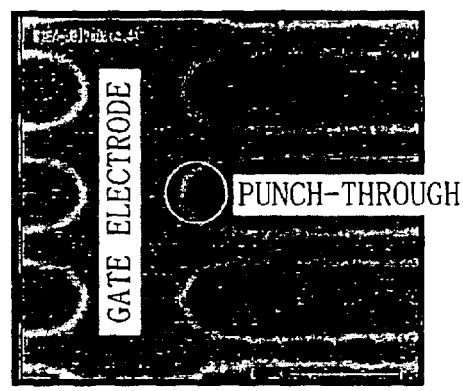
Figure 3B:
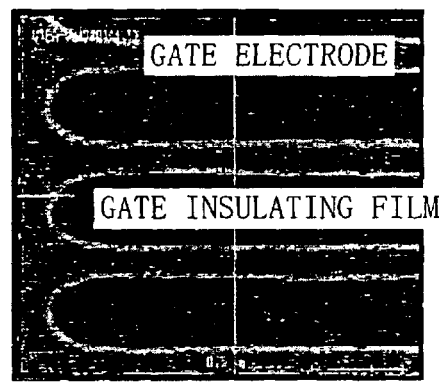

FIG. 3A and FIG. 3B are scanning electron microscope (SEM) pictures illustrating a gate electrode having a comb shape as viewed from above and a gate insulating film on an active region, wherein FIG. 3A illustrates a state where a punch-through has occurred in the gate insulating film, and FIG. 3B illustrates a state where a punch-through has not occurred in the gate insulating film.

Figure 3C:
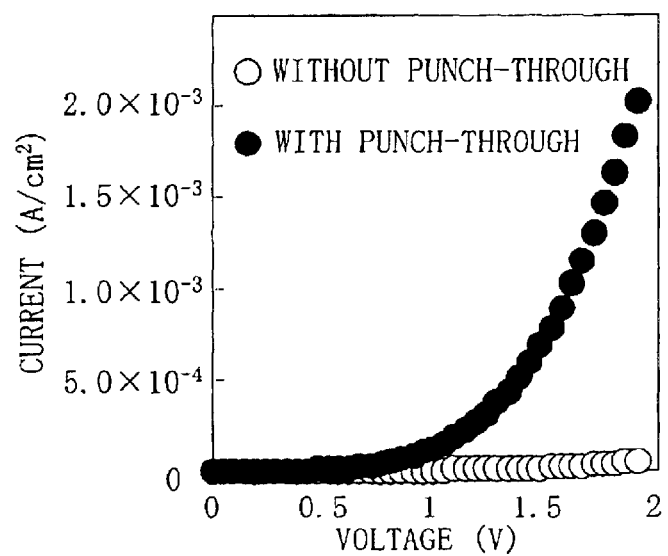
FIG. 3C is a graph illustrating the I–V characteristics of the p-n junction in a state of FIG. 3A where a punch-through has occurred, and in a state of FIG. 3B where a punch-through has not occurred.

Moreover, FIG. 3C illustrates the I–V characteristics of the p-n junction in a state of FIG. 3A where a punch-through has occurred, and in a state of FIG. 3B where a punch-through has not occurred.

As described above, the measurement electrode 20, which is electrically insulated from the gate electrode 15 formed by patterning as a part of the semiconductor device, is provided on the gate insulating film 14, whereby the leakage current through the p-n junction formed between the $n^+$-type layer 16 and the semiconductor substrate 11, i.e., the leakage current through the p-n junction due to a damage to the gate insulating film 14, can be measured without applying a voltage to the gate electrode 15. In this way, it is possible to electrically evaluate the presence/absence of a punch-through occurring in the gate insulating film 14 during the dry etching step for forming the gate electrode 15 by patterning. As a result, the step of inspecting a damage to the gate insulating film 14, which is performed after the formation of the gate electrode 15, can be performed electrically, thus replacing the inspection through visual observation, which is instable and unreliable and which is also low in productivity.

Note that while polycrystalline silicon doped with an impurity is used for the gate electrode 15 in the description above, the material may alternatively be amorphous silicon doped with an impurity, a metal such as tungsten (W) or molybdenum (Mo), or a silicide of a metal such as tungsten, molybdenum or cobalt (Co).

Similarly, while polycrystalline silicon doped with an impurity is used for the measurement electrode 20 in the description above, the material may alternatively be a metal such as aluminum (Al), an aluminum-containing alloy or tungsten.

Specific methods for evaluating a gate insulating film, i.e., methods for determining a sample to be non-defective or defective, will now be described with reference to the drawings.

FIG. 4A to FIG. 4C each illustrate a method for determining the quality of a gate insulating film by using a method for evaluating a gate insulating film according to the first embodiment of the present invention, wherein FIG. 4A illustrates the first determination method, which is based on a reference leakage current value, FIG. 4B illustrates the second determination method, which is based on the difference between leakage currents for different applied voltages (measured voltages), and FIG. 4C illustrates the third determination method, which is based on the ratio (rate of change) of the leakage current increment with respect to the applied voltage increment.

First Determination Method

First, according to the first determination method, for example, a sample is determined to be defective when the leakage current value is equal to or greater than $5.0\times10^{-4}$ A/cm² and non-defective when it is less than $5.0\times10^{-4}$ A/cm², as illustrated in FIG. 4A.

Thus, the determination of the first method can be expressed by Expression (1) below:

$$I_{leak} - \alpha \geq 0 \quad (1)$$

where $I_{leak}$ is the value of the leakage current of the evaluated sample, and $\alpha$ is the reference value.

Second Determination Method

Next, according to the second determination method, for example, a first difference value $\Delta I_1$ between the leakage current of a first sample and the leakage current of a second sample for a first applied voltage $V_1$ (=1.5 V) is calculated, and a second difference value $\Delta I_2$ between the leakage current of the first sample and the leakage current of the second sample for a second applied voltage $V_2$ (=2 V) is similarly calculated, as illustrated in FIG. 4B. Herein, it is determined that a punch-through has occurred in a sample and that the sample is defective if the second difference value $\Delta I_2$ is equal to or greater than first difference value $\Delta I_1$. Moreover, the second applied voltage $V_2$ is greater than the first applied voltage $V_1$.

Thus, the determination can be expressed by Expression (2) below:

$$\Delta I_2 - \Delta I_1 \geq 0 \quad (2)$$

The first sample is determined to be defective if Expression (2) holds, and non-defective if Expression (2) does not hold.

Third Determination Method

Next, according to the third determination method, for example, a shift amount $\Delta I_1$ in the leakage current for a first voltage interval $\Delta V_1$ between a first applied voltage $V_1$ (=1 V) and a second applied voltage $V_2$ (=1.5 V) is calculated, and a shift amount $\Delta I_2$ in the leakage current for a second voltage interval $\Delta V_2$ between the second applied voltage $V_2$ (=1.5 V) and a third applied voltage $V_3$ (=2 V) is similarly calculated, as illustrated in FIG. 4C. Herein, the first applied voltage $V_1$, the second applied voltage $V_2$ and the third applied voltage $V_3$ satisfy $V_1 < V_2 < V_3$.

Thus, the determination can be expressed by Expression (3) below:

$$\Delta I_2/\Delta V_2 - \Delta I_1/\Delta V_1 > 0 \quad (3)$$

The sample is determined to be defective if Expression (3) holds, and non-defective if Expression (3) does not hold.

Note that the present invention can be used not only to determine the presence/absence of a damage to the gate insulating film 14 so as to determine the gate insulating film 14 to be non-defective or defective, but also to set the etching conditions for a dry etching process using an ICP etcher, etc., or to evaluate the change over time in the set etching conditions.

Second Embodiment

The second embodiment of the present invention will now be described with reference to the drawings.

FIG. 5A to FIG. 5E are cross-sectional views sequentially illustrating steps of a method for manufacturing a device for evaluating a gate insulating film according to the second embodiment of the present invention.

Figure 5A:
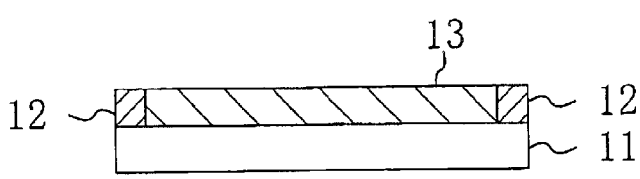

First, as illustrated in FIG. 5A, the device isolation regions 12 having a shallow trench structure, for example, are selectively formed in an upper portion of the semiconductor substrate 11 made of silicon. Then, a p-type impurity ion such as boron (B) ion is implanted into the semiconductor substrate 11 so as to form a p⁺-type layer 13 to be a p-type well.

Figure 5B:
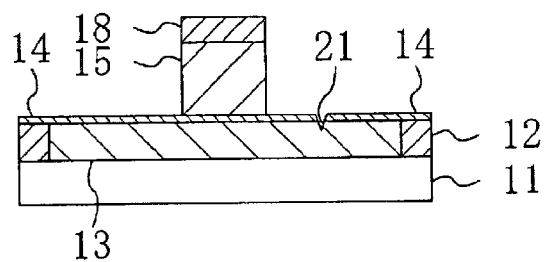

Then, as illustrated in FIG. 5B, the gate insulating film 14 having a thickness of about 2 nm, for example, is deposited across the entire principal surface of the semiconductor substrate 11 by using a thermal oxidization method, or the like. Then, a gate electrode forming film made of polycrystalline silicon doped with an n-type impurity and a mask forming film made of silicon oxide are deposited in this order by using a CVD method. Then, a mask film 18 having a gate electrode pattern is formed from the mask forming film by using a photolithography method and a dry etching method. Then, the gate electrode forming film is subjected to a dry etching process by an inductively-coupled plasma method using the mask film 18 as a mask so as to form the gate electrode 15 having a gate length of about 0.1 μm, for example, from the gate electrode forming film. Herein, the mask film 18 on the gate electrode 15 is left unremoved. In this process, the punch-through 21 may occur in a region of the gate insulating film 14 in the vicinity of the side surface of the gate electrode 15 by the mechanism illustrated in FIG. 13.

Figure 5C:
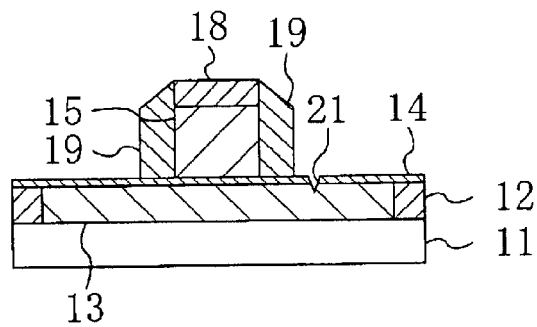

Then, as illustrated in FIG. 5C, an insulating film made of silicon nitride, for example, is deposited across the entire upper surface of the semiconductor substrate 11 including the gate electrode 15 by using a CVD method, and then a side wall 19 covering the side surfaces of the gate electrode 15 and the mask film 18 is formed from the deposited insulating film by using an etch-back method.

Figure 5D:
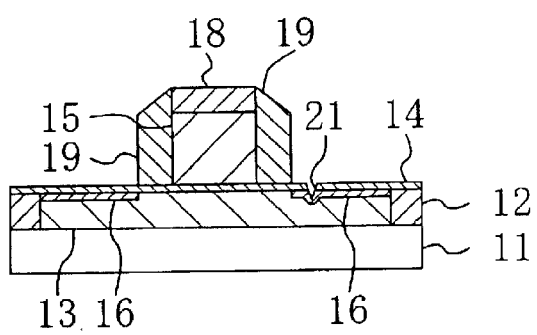

Then, as illustrated in FIG. 5D, arsenic (As) ion is implanted into the semiconductor substrate 11 under implantation conditions including an acceleration energy of about 3 keV and an implantation dose of about $1.5\times10^{15}$ cm², for example, using the mask film 18 and the side wall 19 as a mask, thereby forming the n⁺-type layer 16 to be a source or a drain having a junction plane that is shallower than the p⁺-type layer 13.

Figure 5E:
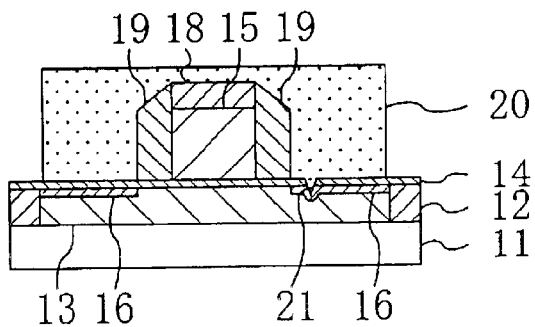

Then, as illustrated in FIG. 5E, a conductive film made of polycrystalline silicon doped with an n-type impurity is deposited by using a CVD method on the semiconductor substrate 11 so as to cover the gate electrode 15 including the mask film 18 and the side wall 19. Then, the deposited conductive film is etched so that the remaining portion extends over the gate electrode 15, thereby forming the measurement electrode 20 from the conductive film.

Thus, according to the second embodiment, the gate electrode 15 and the measurement electrode 20 are electrically insulated from each other by the mask film 18, which is left unremoved on the gate electrode 15 after the dry etching step for forming the gate electrode 15 by patterning, and by the side wall 19, which is provided on the side surface of the gate electrode 15.

Note that the punch-through 21 may be filled with silicon nitride during the formation of the side wall 19. However, even in such a case, the nitride silicon in the punch-through 21 is removed during the subsequent etch-back process, thereby turning the punch-through 21 back into a hole. Furthermore, during the subsequent step of forming the measurement electrode 20, the punch-through 21 is filled with conductive polycrystal silicon of the measurement electrode 20.

Herein, while the $p^+$-type layer 13 is formed by ion implantation, the presence/absence of a damage to the gate insulating film 14 may be electrically evaluated alternatively by using the semiconductor substrate 11 of a p-type conductivity.

Third Embodiment

The third embodiment of the present invention will now be described with reference to the drawings.

FIG. 6A and FIG. 6B illustrate a device for evaluating a gate insulating film according to the third embodiment of the present invention, wherein FIG. 6A is a plan view, and FIG. 6B is an SEM picture showing a portion of the device in the vicinity of the gate electrode.

The third embodiment provides an improved detection sensitivity in detecting the presence/absence of a damage to a gate insulating film as compared with the device for evaluating a gate insulating film of the first or second embodiment. Again, a device for evaluating the presence/absence of a damage to a gate insulating film on an active region of one of a plurality of transistors formed on a semiconductor wafer is illustrated for ease of understanding. Note that in FIG. 6A, those elements that are already shown in FIG. 1A are denoted by the same reference numerals and will not be further described below.

As illustrated in FIG. 6A, a gate electrode 25 of the third embodiment includes protruding portions 25a that are protruding in a comb-like shape in the gate length direction from both sides of the gate electrode 25. Note that although not shown in the figure, the upper surface and the side surface of the gate electrode 25 are covered with an insulating film that electrically insulates the gate electrode 25 from the measurement electrode 20.

Moreover, a p-n junction is formed in the semiconductor substrate 11 between the $p^+$-type layer 13 and the $n^+$-type layer 16 surrounded by the device isolation regions 12, by a method as that of the first embodiment.

Moreover, FIG. 6A shows a punch-through occurring region 21A surrounded by the gate electrode 25 and the protruding portions 25a thereof along three of the four sides thereof The punch-through occurring region 21A is a region of the gate insulating film where a punch-through is most likely to occur.

FIG. 6B is an SEM picture showing the punch-through occurring region 21A on an enlarged scale, and actual punch-throughs 21 are shown in the SEM picture.

Thus, when a region is surrounded by the gate electrode 25 along three sides thereof, the etchant, whose main component is ion and which is supplied from a plasma in an anisotropic manner, impinges on the region in sufficient amounts, whereas the depositing radical, which is supplied in an isotropic manner, is not sufficiently supplied to the region due to the shadowing effect of the gate electrode 25, during the patterning process for forming the gate electrode 25. As a result, the punch-through occurring region 21A is likely to be in a state where the flux of the etchant is larger than the flux of the depositing radical. Specifically, the flux of the etchant is reflected by the side surfaces of the gate electrode 25 and the protruding portions 25a thereof, and is thus locally supplied to the gate insulating film. Therefore, as compared with a region that is shaded only by one side wall, a region that is surrounded by the gate electrode 25 along three sides thereof receives a greater amount of etchant, whereby the etching of the gate insulating film 14 is likely to proceed locally in such a region.

Thus, according to the third embodiment, the gate electrode 25 is formed in a comb-like shape as viewed from above, thereby increasing the frequency of occurrence of a punch-through in the gate insulating film during the dry etching process for forming the gate electrode 25.

Furthermore, by increasing the number of punch-throughs occurring in the gate insulating film, it is possible to substantially increase the leakage current through the p-n junction, thereby facilitating the measurement of the leakage current.

Fourth Embodiment

The fourth embodiment of the present invention will now be described with reference to the drawings.

In the fourth embodiment, a method for evaluating the correlation between the gate electrode pattern proportion and the punch-through occurring in the gate insulating film will be described. The term "gate electrode pattern proportion" as used herein is defined as a value obtained by dividing the area of a semiconductor chip that is occupied by the gate electrode pattern by the total area of the semiconductor chip.

FIG. 7 is a plan view illustrating a device for evaluating a gate insulating film according to the fourth embodiment of the present invention. In FIG. 7, those elements that are already shown in FIG. 6A are denoted by the same reference numerals and will not be further described below.

As illustrated in FIG. 7, the device for evaluating a gate insulating film of the fourth embodiment includes a dummy electrode 26 that is formed on the gate insulating film 14 so as to extend on both sides of the gate electrode 25 with an interval from the protruding portions 25a of the gate electrode 25. The dummy electrode 26 is made of the same material as the gate electrode 25, and is formed simultaneously with the gate electrode 25 through patterning in the dry etching process for forming the gate electrode 25.

Therefore, it is possible to arbitrarily change the gate electrode pattern proportion by changing the shape of the dummy electrode 26 as viewed from above. Thus, it is possible to evaluate the correlation between the gate electrode pattern proportion resulting in the dry etching step for forming the gate electrode 25 and the punch-through occurring in the gate insulating film 14 in the dry etching step. Note that while the dummy electrode 26 is provided on both sides of the gate electrode 25 in the illustrated example, the dummy electrode 26 may alternatively be provided only on one side of the gate electrode 25.

FIG. 8 illustrates the relationship between the gate electrode pattern proportion and the defect rate due to the punch-through in the gate insulating film, which is obtained by using the device for evaluating a gate insulating film of the fourth embodiment.

It is believed that the frequency of occurrence of defects due to the punch-through changes along with the gate electrode pattern proportion for the following reasons.

As described above, a mixture of hydrogen bromide (HBr), chlorine ($Cl_2$) and oxygen ($O_2$), or the like, is used as an etching gas in the dry etching process for forming a gate electrode made of polycrystalline silicon. In this process, what forms the depositing radical is $SiBr_xO_y$ (where x and y are integers), which is a product of the reaction between the etchants and silicon (Si).

Incidentally, as the gate electrode pattern proportion increases, the amount of polycrystalline silicon to be etched decreases, and thus the amount of the reaction product, $SiBr_xO_y$, also decreases. As a result, the flux of the etchant will be larger than the flux of the depositing radical, thereby increasing the punch-through occurring in the gate insulating film.

Conversely, when the gate electrode pattern proportion is excessively small, the amount of polycrystalline silicon to be etched increases to produce a large amount of reaction product. This results in an insufficient supply of oxygen radical (O*), which produces the depositing radical, from a plasma, and the flux of the etchant is larger than the flux of the depositing radical, thereby also increasing the defect rate.

It can be seen from above that there exists an optimal range for the gate electrode pattern proportion in which it is possible to suppress the defect rate due to the punch-through in the gate insulating film.

According to the experiment results, the defect rate due to the punch-through in the gate insulating film is 0% if the gate electrode pattern proportion is in the range of 20% to 40%, and the punch-through occurring in the gate insulating film increases if the gate electrode pattern proportion is 50% or more. For example, the defect rate is about 80% if the pattern proportion is 90%.

Thus, it can be seen that it is possible to suppress the defect due to the punch-through in the gate insulating film by setting the gate electrode pattern proportion to be about 20% to 40% when designing the gate pattern.

As described above, with the device for evaluating a gate insulating film of the fourth embodiment, it is possible to obtain the correlation between the gate electrode pattern proportion and the punch-through in the gate insulating film, and the correlation can be fed back to the design rule. Therefore, it is possible to prevent the occurrence of a defect due to the punch-through in the gate insulating film by appropriately determining the gate electrode pattern proportion in the design process.

Fifth Embodiment

The fifth embodiment of the present invention will now be described with reference to the drawings.

In the fifth embodiment, a method for evaluating the position at which a punch-through occurs in the gate insulating film will be described. Specifically, a first evaluation device and a second evaluation device having side walls of different thicknesses are produced, and the position at which a punch-through has occurred is evaluated based on the difference in the leakage current value between the devices.

Herein, the thickness of the side wall in the substrate plane direction of the second evaluation device is set to be larger than that of the first evaluation device.

Method for Manufacturing First Evaluation Device

FIG. 9A to FIG. 9E are cross-sectional views sequentially illustrating steps of a method for manufacturing a first evaluation device for evaluating a gate insulating film according to the fifth embodiment of the present invention.

Figure 9A:
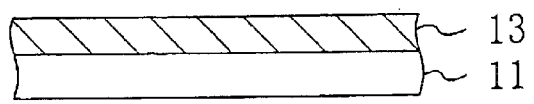

First, device isolation regions (not shown) are selectively formed in an upper portion of the semiconductor substrate 11 made of silicon by a method as that of the second embodiment. Then, as illustrated in FIG. 9A, p-type impurity ion is implanted into the semiconductor substrate 11 so as to form the $p^+$-type layer 13 to be a p-type well.

Figure 9B:
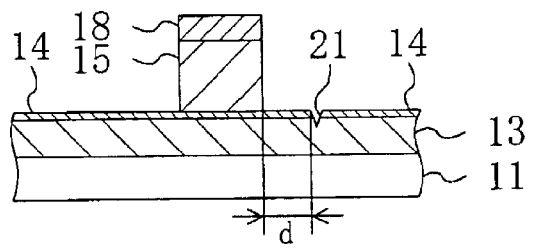

Then, as illustrated in FIG. 9B, the gate insulating film 14 having a thickness of about 2 nm, for example, is deposited across the entire principal surface of the semiconductor substrate 11 by using a thermal oxidization method, or the like. Then, a gate electrode forming film made of polycrystalline silicon doped with an n-type impurity and a mask forming film made of silicon oxide are deposited in this order by using a CVD method. Then, the mask film 18 having a gate electrode pattern is formed from the mask forming film, and then the gate electrode forming film is subjected to a dry etching process by an inductively-coupled plasma method using the mask film 18 as a mask so as to form the gate electrode 15 having a gate length of about 0.1 nm, for example, from the gate electrode forming film. Again, the mask film 18 on the gate electrode 15 is left unremoved. Now, it is assumed that the punch-through 21 occurs at a position in the gate insulating film 14 at a distance of d, for example, from the side surface of the gate electrode 15 because the amount of supply of the depositing radical onto the semiconductor substrate 11 is insufficient and the thickness of the gate insulating film 14 is less than about 10 nm, as described above.

Figure 9C:
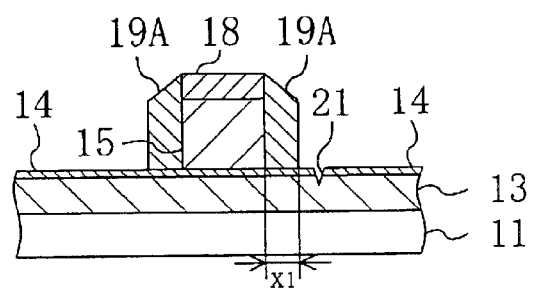

Then, as illustrated in FIG. 9C, an insulating film made of silicon nitride, for example, is deposited across the entire upper surface of the semiconductor substrate 11 including the gate electrode 15 by using a CVD method, and then a side wall 19A covering the side surfaces of the gate electrode 15 and the mask film 18 is formed from the deposited insulating film by using an etch-back method. Herein, the thickness $x_1$ of the side wall 19A in the substrate plane direction is less than the distance d between the punch-through 21 and the side surface of the gate electrode 15.

Figure 9D:
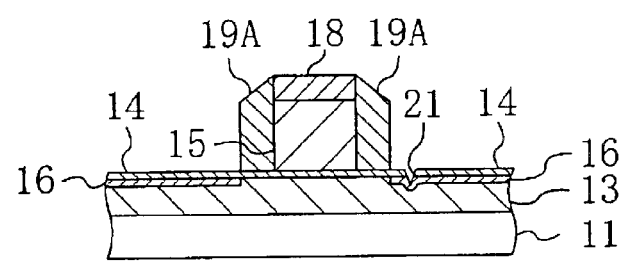

Then, as illustrated in FIG. 9D, n-type impurity ion is implanted into the semiconductor substrate 11 using the mask film 18 and the side wall 19A as a mask, thereby forming the $n^+$-type layer 16 to be a source or a drain having a junction plane that is shallower than the $p^+$-type layer 13.

Figure 9E:
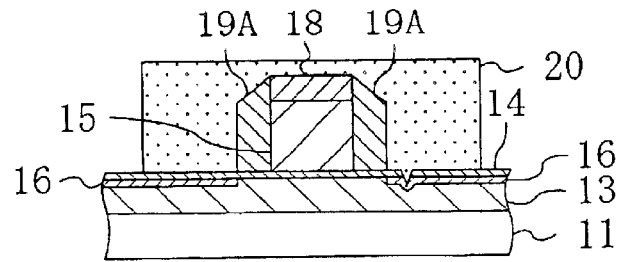

Then, as illustrated in FIG. 9E, a conductive film made of polycrystalline silicon doped with an n-type impurity is deposited by using a CVD method on the semiconductor substrate 11 so as to cover the gate electrode 15 including the mask film 18 and the side wall 19A. Then, the deposited conductive film is etched so that the remaining portion extends over the gate electrode 15, thereby forming the measurement electrode 20 from the conductive film.

Method for Manufacturing Second Evaluation Device

FIG. 10A to FIG. 10E are cross-sectional views sequentially illustrating steps of a method for manufacturing a second evaluation device for evaluating a gate insulating film according to the fifth embodiment of the present invention.

Figure 10A:

First, device isolation regions (not shown) are formed in an upper portion of the semiconductor substrate 11 made of silicon by a method as that for the first evaluation device. Then, as illustrated in FIG. 10A, p-type impurity ion is implanted into the semiconductor substrate 11 so as to form the p$^+$-type layer 13 to be a p-type well.

Figure 10B:
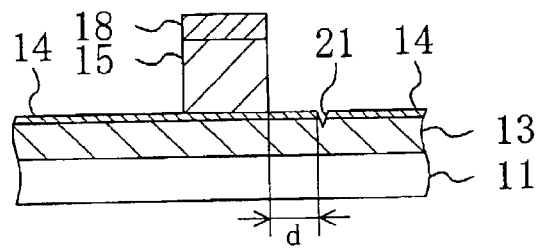

Then, as illustrated in FIG. 10B, the gate insulating film 14 having a thickness as that of the first evaluation device is deposited across the entire principal surface of the semiconductor substrate 11 by using a thermal oxidization method, or the like. Then, a gate electrode forming film made of polycrystalline silicon doped with an n-type impurity and a mask forming film made of silicon oxide are deposited in this order by using a CVD method. Then, the mask film 18 having a gate electrode pattern is formed from the mask forming film, and then the gate electrode forming film is subjected to a dry etching process by an inductively-coupled plasma method using the mask film 18 as a mask so as to form the gate electrode 15 having a gate length as that of the first evaluation device from the gate electrode forming film. Again, it is assumed that the punch-through 21 occurs at a position in the gate insulating film 14 at a distance of d, for example, from the side surface of the gate electrode 15 because the amount of supply of the depositing radical onto the semiconductor substrate 11 is insufficient and the thickness of the gate insulating film 14 is less than about 10 nm.

Figure 10C:
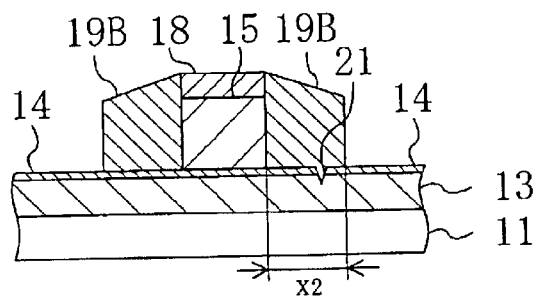

Then, as illustrated in FIG. 10C, an insulating film made of silicon nitride, for example, is deposited across the entire upper surface of the semiconductor substrate 11 including the gate electrode 15 by using a CVD method, and then a side wall 19B covering the side surfaces of the gate electrode 15 and the mask film 18 is formed from the deposited insulating film by using an etch-back method. The patterning process is performed so that the thickness $x_2$ of the side wall 19B of the second evaluation device in the substrate plane direction is larger than the thickness $x_1$ of the side wall 19A of the first evaluation device in the substrate plane direction. Herein, the thickness $x_1$ of the side wall 19B in the substrate plane direction is greater than the distance d between the punch-through 21 and the side surface of the gate electrode 15.

Figure 10D:
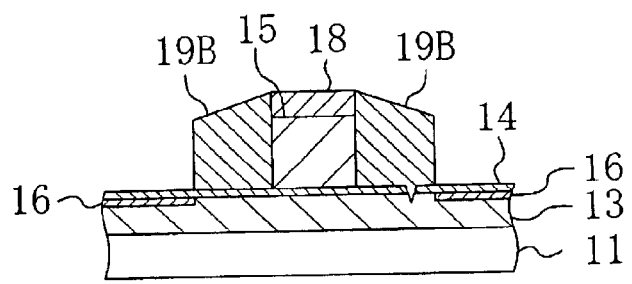

Then, as illustrated in FIG. 10D, n-type impurity ion is implanted into the semiconductor substrate 11 using the mask film 18 and the side wall 19B as a mask, thereby forming the n$^+$-type layer 16 to be a source or a drain having a junction plane that is shallower than the p$^+$-type layer 13.

Figure 10E:
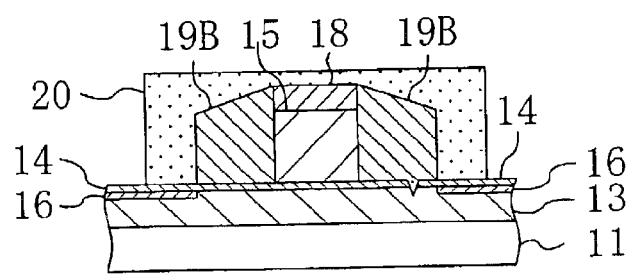

Then, as illustrated in FIG. 10E, a conductive film made of polycrystalline silicon doped with an n-type impurity is deposited by using a CVD method on the semiconductor substrate 11 so as to cover the gate electrode 15 including the mask film 18 and the side wall 19B. Then, the deposited conductive film is etched so that the remaining portion extends over the gate electrode 15, thereby forming the measurement electrode 20 from the conductive film.

Method for Evaluating Position of Punch-Through

A method for determining the position at which the punch-through 21 has occurred by using the first evaluation device and the second evaluation device having the side wall 19A and the side wall 19B, respectively, formed on the side surface of the gate electrode 15 will now be described. The side wall 19A and the side wall 19B are formed by patterning through a dry etching step under the same conditions but have different thicknesses.

First, a measurement voltage is applied between the measurement electrode 20 and the semiconductor substrate 11 of the first evaluation device so that the p-n junction is reverse-biased, as in the first embodiment, and the leakage current through the p-n junction is measured. As a result, a relatively large leakage current is observed through the p-n junction.

In contrast, when the measurement voltage is applied between the measurement electrode 20 and the semiconductor substrate 11 of the second evaluation device so that the p-n junction is reverse-biased, substantially no leakage current is observed.

It can be confirmed, based on the p-n junction measurement results and without performing any visual observation, that the distance d between the punch-through 21 and the side surface of the gate electrode 15 is greater than the thickness $x_1$ of the side wall 19A and is less than the thickness $x_2$ of the side wall 19B. Note that the specific method for determining the presence/absence of the punch-through 21 may be, for example, any of the first to third determination methods described above in the first embodiment.

Thus, according to the fifth embodiment, the distance d between the punch-through 21 in the gate insulating film 14 and the side surface of the gate electrode 15 can be electrically evaluated by measuring the leakage current through the p-n junction by using a plurality of evaluation devices that have different thicknesses of the side wall 19 provided on the side surface of the gate electrode 15 (different side wall lengths).

As described above, the position of the punch-through 21 occurring in the gate insulating film 14 is dependent on the reflection of the etchant by the side surface of the gate electrode 15. Therefore, if the position at which the punch-through 21 has occurred can be evaluated, it is possible to optimize factors that determine the angle at which the etchant impinges on the gate electrode 15 during the dry etching step, such as etching conditions including the pressure during the etching process, and the height of the gate electrode 15.

Note that while the gate electrodes 15 and 25 are of the n-type conductivity in each of the first to fifth embodiments, effects as those described above can of course be obtained when the gate electrodes 15 and 25 are of a p-type conductivity.

Moreover, while the insulating film to be evaluated is the gate insulating film in each of the first to fifth embodiments, the present invention is not limited thereto and can be used with members other than the gate insulating film. The present invention is effective in cases where a member that is made of a semiconductor, an insulator or a conductor and formed on an insulating film is patterned through a dry etching process using a plasma, wherein there is a p-n junction below the insulating film and the insulating film is used as an etch-stop layer.

Moreover, the dry etching process used in the patterning for forming the gate electrodes 15 and 25 is not limited to an inductively-coupled plasma etching process, but may be any etching process that uses a plasma.

What is claimed is:

1. A method for evaluating an insulating film, comprising:
   a first step of forming an insulating film on a semiconductor substrate including at an upper portion thereof a first semiconductor region of a first conductivity type;
   a second step of selectively forming an electrode pattern on the insulating film;
   a third step of introducing an impurity of a second conductivity type into the semiconductor substrate using the electrode pattern as a mask so as to form a second semiconductor region of the second conductivity type in an upper portion of the first semiconductor region, thereby forming a p-n junction at an interface between the first semiconductor region and the second semiconductor region;

a fourth step of forming a measurement electrode on the insulating film so as to be electrically insulated from the electrode pattern; and a fifth step of applying a measurement voltage between the measurement electrode and the semiconductor substrate via the insulating film and measuring a leakage current leaking through the p-n junction so as to evaluate a damage to the insulating film or the semiconductor substrate.

2. The method for evaluating an insulating film of claim 1, wherein in the fifth step, the insulating film is determined to be defective if a value of the leakage current is greater than a predetermined value, whereas the insulating film is determined to be non-defective if the value of the leakage current is less than or equal to the predetermined value.

3. The method for evaluating an insulating film of claim 1, wherein in the fifth step, a value of a first leakage current occurring in response to a first measurement voltage is compared with a value of a second leakage current occurring in response to a second measurement voltage that is higher than the first measurement voltage, and the insulating film is determined to be defective if the value of the second leakage current is greater than the value of the first leakage current, whereas the insulating film is determined to be non-defective if the value of the second leakage current is less than or equal to the value of the first leakage current.

4. The method for evaluating an insulating film of claim 1, wherein in the fifth step, the insulating film is determined to be defective if a rate of change of the leakage current increases as the measurement voltage is increased, whereas the insulating film is determined to be non-defective if the rate of change of the leakage current does not substantially change as the measurement voltage is increased.

5. The method for evaluating an insulating film of claim 1, wherein the electrode pattern has a comb-like shape as viewed from above.

6. The method for evaluating an insulating film of claim 1, wherein the second step includes a step of forming a dummy electrode pattern on the insulating film with an interval from the electrode pattern.

7. The method for evaluating an insulating film of claim 1, wherein:

the first step includes a step of preparing a first semiconductor substrate and a second semiconductor substrate having the same structure as that of the semiconductor substrate;

the fourth step includes, before forming the measurement electrode:

a step of forming a first side wall insulating film on a side surface of an electrode pattern on the first semiconductor substrate; and a step of forming a second side wall insulating film on a side surface of an electrode pattern on the second semiconductor substrate, the second side wall insulating film having a thickness different from that of the first side wall insulating film, wherein in the fifth step, the first semiconductor substrate on which the first side wall insulating film has been formed, and the second semiconductor substrate on which the second side wall insulating film has been formed, are each evaluated.

8. The method for evaluating an insulating film of claim 1, wherein the insulating film is a gate insulating film and the electrode pattern is a gate electrode.

9. A device for evaluating an insulating film, comprising:

a first insulating film formed on an upper surface of a semiconductor substrate including a p-n junction therein;

an electrode pattern selectively formed on the first insulating film; and a measurement electrode formed on the first insulating film, with a second insulating film being interposed between the electrode pattern and the measurement electrode.

10. The device for evaluating an insulating film of claim 9, wherein the electrode pattern has a comb-like shape as viewed from above.

11. The device for evaluating an insulating film of claim 9, further comprising a dummy electrode pattern formed on the first insulating film with an interval from the electrode pattern.

12. The device for evaluating an insulating film of claim 9, wherein the first insulating film is a gate insulating film and the electrode pattern is a gate electrode.

13. A method for manufacturing an insulating film evaluation device, comprising:

a first step of forming a first insulating film on an upper surface of a semiconductor substrate including a first semiconductor region of a first conductivity type formed in an upper portion of the semiconductor substrate;

a second step of selectively forming an electrode pattern on the first insulating film;

a third step of introducing an impurity of a second conductivity type into the semiconductor substrate using the electrode pattern as a mask so as to form a second semiconductor region of the second conductivity type in an upper portion of the first semiconductor region, thereby forming a p-n junction at an interface between the first semiconductor region and the second semiconductor region; and a fourth step of forming a measurement electrode on the first insulating film, with a second insulating film being interposed between the electrode pattern and the measurement electrode.

14. The method for manufacturing an insulating film evaluation device of claim 13, wherein in the second step, the electrode pattern is patterned into a comb-like shape as viewed from above.

15. The method for manufacturing an insulating film evaluation device of claim 13, wherein the second step includes a step of forming a dummy electrode pattern on the insulating film with an interval from the electrode pattern.

16. The method for manufacturing an insulating film evaluation device of claim 13, wherein the first insulating film is a gate insulating film and the electrode pattern is a gate electrode.

* * * * *